United States Patent [19]

Konishi et al.

[11] 4,221,965
[45] Sep. 9, 1980

[54] SCANNING TYPE ELECTRON MICROSCOPE

[75] Inventors: Tadao Konishi, Katsuta; Yoshiharu Utsumi, Tokyo, both of Japan

[73] Assignee: Hitachi, Ltd., Japan

[21] Appl. No.: 934,716

[22] Filed: Aug. 21, 1978

[30] Foreign Application Priority Data

Aug. 23, 1977 [JP] Japan .................................. 52/101221

[51] Int. Cl.² ............................................. G01M 23/00
[52] U.S. Cl. ....................................... 250/311; 250/451
[58] Field of Search ................................. 250/311, 451

[56] References Cited

U.S. PATENT DOCUMENTS 4,039,829  8/1977  Kato et al. ............................ 250/310

*Primary Examiner*—Harold A. Dixon
*Attorney, Agent, or Firm*—Craig & Antonelli

[57] ABSTRACT

A sample is bidimensionally scanned with an electron beam to display an image of the sample based on a secondary-electron signal generated from the sample. Two marks corresponding to two points on the sample are displayed in superposition to the image and a distance between the two points on the sample is calculated based on coordinates of the marks and a tilting angle of the sample to the electron beam.

4 Claims, 11 Drawing Figures

SCANNING TYPE ELECTRON MICROSCOPE

The present invention relates to a scanning type electron microscope, and more particularly to a scanning type electron microscope capable of measuring a distance between different first and second points on a sample.

As is well known, in a scanning type electron microscope, a sample is bidimensionally scanned with an electron beam, and an information signal inherent to the sample and derived from the sample (secondary-electron signal, reflected-electron signal, absorbed-electron signal, transmitted-electron signal, Auger electron signal, cathode luminescense signal, X-ray signal, etc.) is supplied to a cathode-ray tube (CRT) as a brightness modulation signal. On the other hand, a screen of the CRT is bidimensionally scanned with an electron beam generated in the CRT, in synchronism with the scan of the sample. As a result, an image of a scanned area of the sample is displayed on the screen of the CRT based on the information signal inherent to the sample.

In such a scanning type electron microscope, it has recently become particularly important to be able to measure a distance between any two points on the sample. Of several technologies which meet the above requirement, one technology is disclosed in the U.S. Pat. No. 4,039,829 entitled "Stereoscopic Measuring Apparatus" issued on Aug. 2, 1977 and assigned to the same assignee as the present invention. According to the technology disclosed in that U.S. Patent, an incident angle of an energized beam to a sample is alternately set to one or the other of two values which differ slightly from each other and two resulting images based on information signals derived from the sample, which images represent images at two different incident angles, are simultaneously displayed at different locations. One of the two images displayed is viewed by a left eye of a viewer while the other image is viewed by a right eye. As a result, the sample can be viewed as a single stereoscopic image. Two marks corresponding to two arbitrary points on the sample are displayed on the two displayed images respectively in superposition thereon so that a distance between the two points on the sample is calculated based on position signals from the marks. According to this technology, the distance between the two arbitrary points on the sample can be measured. However, in order to measure the distance in the disclosed technology, means for alternately, repetitively and rapidly setting the incident angle of the energized beam to the sample to one or the other of the two slightly different values is required. This means that, in a scanning type electron microscope of a type which does not carry out stereoscopic display of the sample, means for alternately, repetitively and rapidly setting the incident angle of the electron beam to the sample to one or the other of the two slightly different values must be additionally provided. One of possible means to attain it is to tilt the electron beam slightly to the sample in a repetitive and rapid manner while the sample is held stationary and another possible means is to tilt the sample slightly to the electron beam in a repetitive and rapid manner. In the latter case, however, it is difficult to view the image of the scanning electron microscope with a high resolution because of mechanical vibration induced and a performance is apt to be lowered due to wear of mechanical parts. Accordingly, in practice, the former has to be adopted. In this case, however, there is raised a problem that an electron optical system of the scanning type electron microscope has to be modified.

It is an object of the present invention to provide a scanning type electron microscope capable of precisely measuring a distance between different first and second points on a sample without modifying an electron optical system.

It is another object of the present invention to provide a scanning type electron microscope capable of precisely measuring a distance between different first and second points on a sample without alternately, repetitively and rapidly changing an incident angle of an electron beam to the sample.

It is a further object of the present invention to provide a scanning type electron microscope capable of precisely measuring a distance between different first and second points on a sample even when the sample is considerably tilted to an electron beam.

It is a still further object of the present invention to provide a scanning type electron microscope capable of precisely measuring a rear distance between different first and second points on a sample even when the sample is rotated by any azimuth angle.

According to the present invention, there is provided a scanning type electron microscope comprising means for generating an electron beam, means for bidimensionally scanning a sample with said electron beam to derive an information signal inherent to said sample from said sample, means for displaying an image of said sample based on said information signal, means for tilting said sample at an angular relative to said electron beam and holding said sample at the titled position, means for displaying, on said image, first and second marks corresponding to different first and second points on said sample, respectively, in superposition on said image, and means for calculating a distance between said first and second points based on coordinates of said first and second marks and said angle.

The above and other objects, features and advantages of the present invention will be apparent from the following description of the preferred embodiments of the invention when taken in conjunction with the accompanying drawings, in which.

Figure 1:
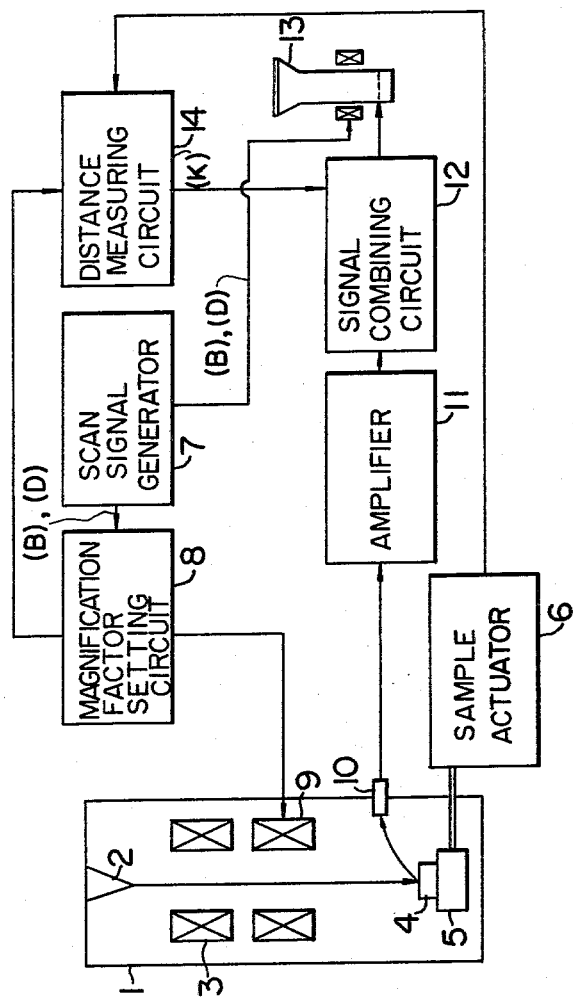
FIG. 1 is a block diagram of one embodiment of a scanning type electron microscope in accordance with the present invention.
Figure 5:
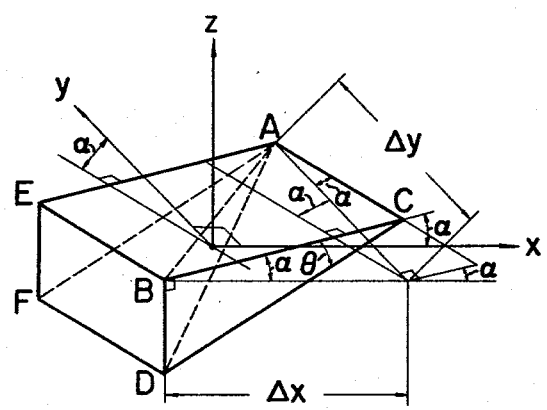
Figure 6:
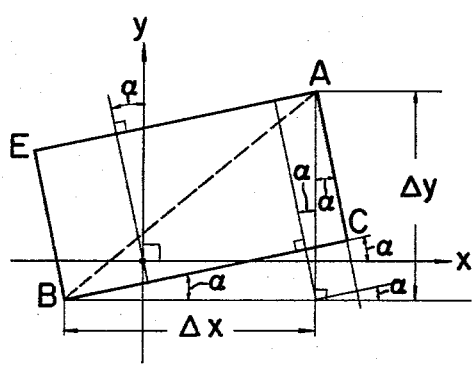
Figure 7:
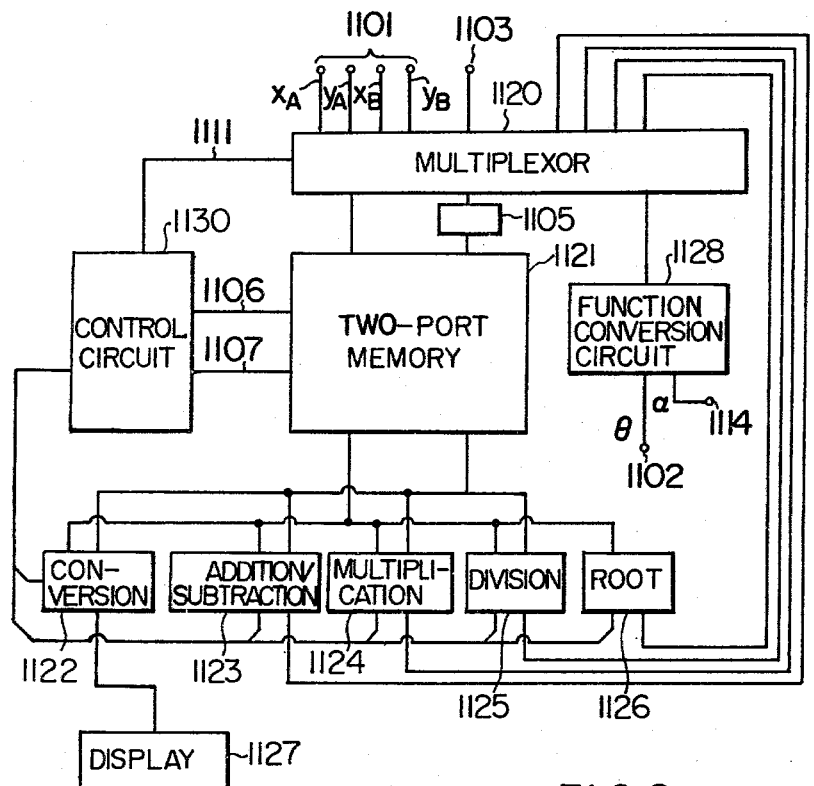
Figure 8A:
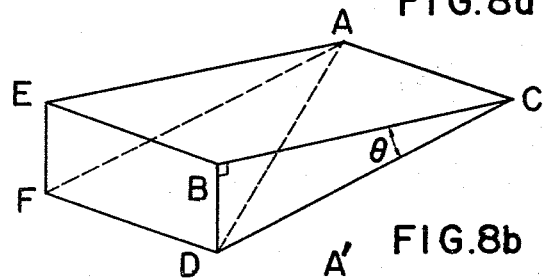
Figure 8B:
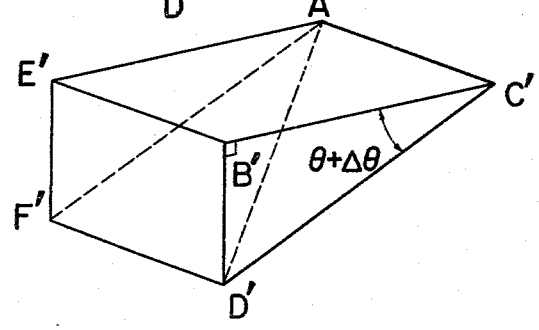
Figure 9:
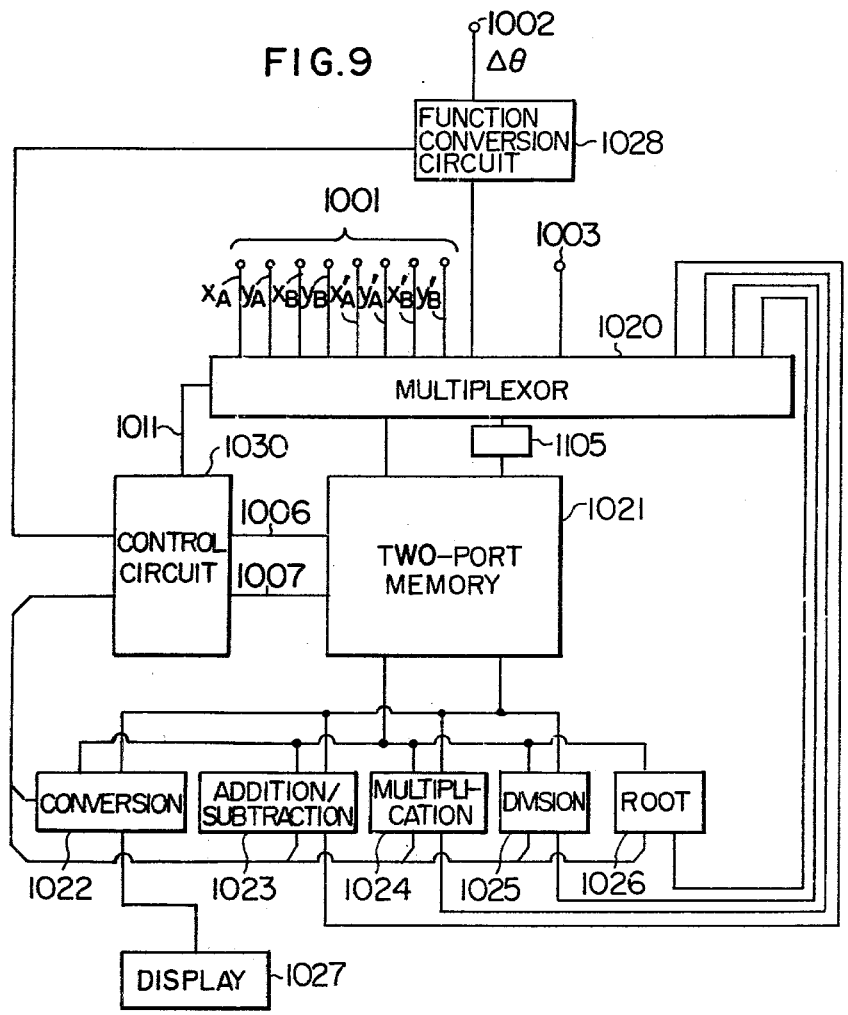
Figure 10:
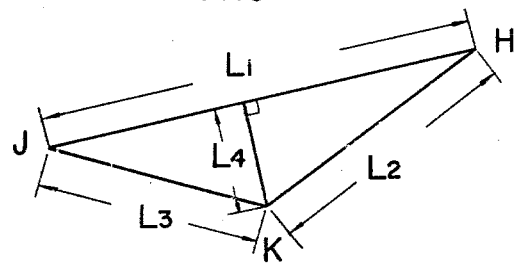

FIG. 5 stereoscopically shows a relation between a sample surface and an image plane;

FIG. 6 is a view as viewed in z-direction in FIG. 5;

FIG. 7 is a block diagram of one embodiment of a distance calculation circuit in the distance measuring circuit shown in FIG. 1;

FIGS. 8a and 8b stereoscopically show relations between the sample surface and the image plane;

FIG. 9 is a block diagram of another embodiment of the distance calculation circuit in the distance measuring circuit shown in FIG. 1; and FIG. 10 shows a chart for illustrating the determination of distances among three points on the sample.

Referring now to FIG. 1, an electron beam emitted from an electron gun 2 disposed within an evacuated tube 1 of a scanning type electron microscope is focused onto a sample 4 by a focusing lens 3. The sample 4 is mounted on a sample mount 5 which is adapted to be tilted by any angle to the electron beam externally of the tube 1 by a sample actuator 6 and held at the tilted position, and also to be rotated by any azimuth angle and held at the rotated position. The sample actuator 6 includes means for sensing a tilt angle and an azimuth angle or a rotation angle of the sample 4 and generating electrical signals representative of those angles.

A scan signal generator 7 generates a sawtooth x-axis scan signal and a sawtooth y-axis scan signal, which are fed to a deflector 9 through a magnification factor setting circuit 8. The electron beam is bidimensionally deflected thereby and hence the sample 4 is bidimensionally scanned with the focused electron beam. As the sample 4 is irradiated by the focused electron beam, an information signal which is characteristic of the sample, such as secondary-electron signal, reflected-electron signal, transmitted-electron signal, absorbed-electron signal, Auger electron signal, X-ray signal or cathode luminescense signal can be derived from the sample 4. In the embodiment illustrated in FIG. 1, a secondary-electron signal derived from the sample 4 is detected by a detector 10, an output of which is fed through an amplifier 11 and a signal combining circuit 12 to a grid of a CRT 13.

The x-axis scan signal and the y-axis scan signal generated by the scan signal generator 7 are also applied to the deflector of the CRT 13 so that a screen of the CRT 13 is bidimensionally scanned in synchronism with the bidimensional scan for the sample 4. As a result, an image of the bidimensional scan area of the sample 4 by the electron beam, based on the secondary-electron signal is displayed on the screen. The magnification factor setting circuit 8 includes means for changing amplitudes of the x-axis signal and y-axis scan signal supplied from the scan signal generator 7. Changing the amplitudes of those signals means to change a magnitude of the scan area of the sample 4, and changing the magnitude of the scan area means to change a magnification factor of the image displayed on the CRT 13. The magnification factor setting circuit 8 also includes means for generating an electrical signal representative of the magnitude changed.

The distance measuring circuit 14 includes means for generating position signals, and means for calculating and displaying a distance between two arbitrary points on the sample based on the position signals, signals representative of the tilt angle and rotation angle supplied from the sample actuator and the magnification factor signal supplied from the magnification factor setting circuit 8. Two variable position signals are generated from the distance measuring circuit 14 and they are combined in the signal combining circuit 12 with the signal from the amplifier 11 and the combined signal is fed to the CRT 13 as a brightness modulation signal. Accordingly, two marks produced by the two variable position signals are displayed in superposition to the image displayed on the CRT 13. Of course, the positions of those marks can be arbitrarily changed by varying the two variable position signals. On the other hand, the distance measuring circuit 14 precisely calculates the real distance between the two points on the sample which correspond to the positions of the two marks based on the two position signals, the tilt angle signal and the rotation angle signal supplied from the sample actuator 6 and the magnification factor signal supplied from the magnification factor setting circuit 8. Of course, the calculation may be made by a microcomputer and the distance may be measured in accordance with programs for the information on the magnification factor, the tilt angle and the rotation angle.

Figure 2:
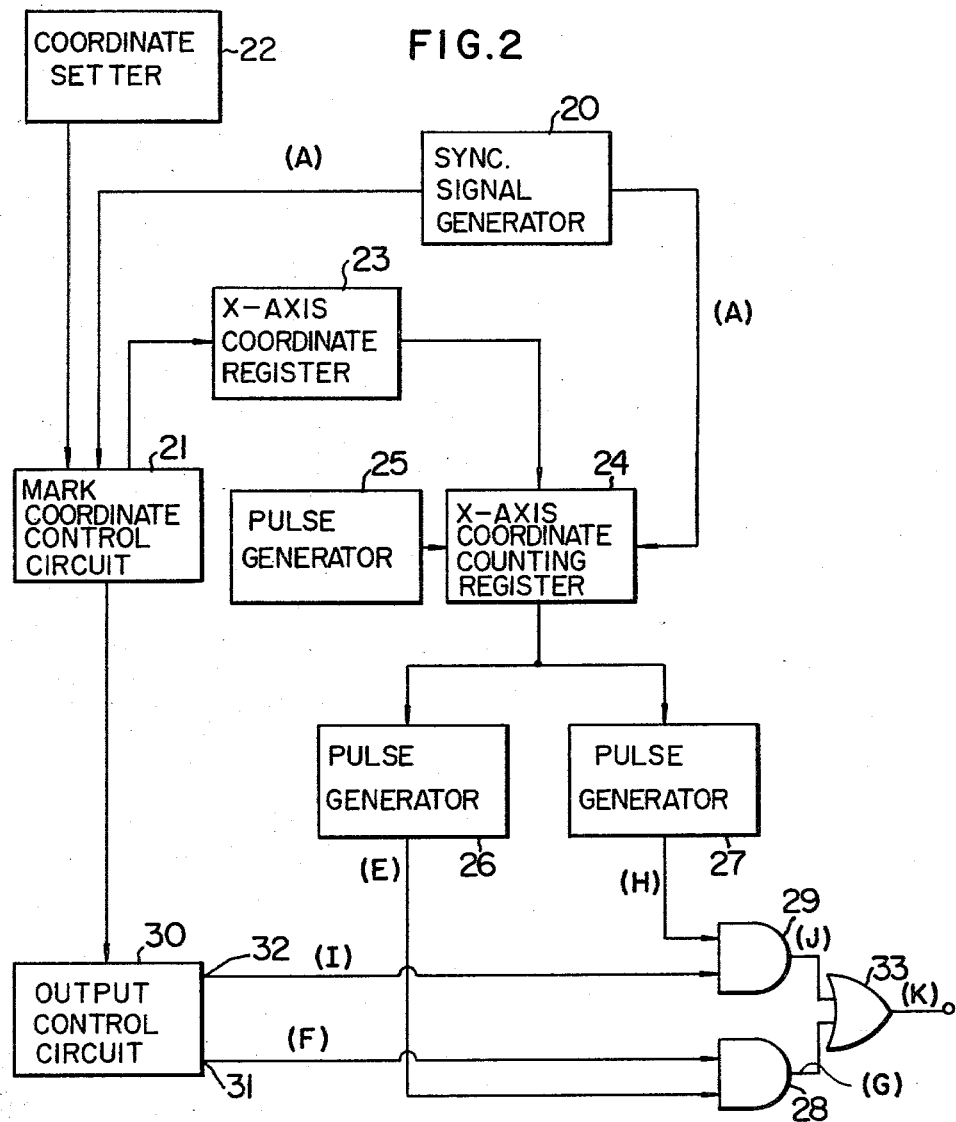
FIG. 2 is a block diagram of one embodiment of a position signal generating circuit in a distance measuring circuit shown in FIG. 1.

FIG. 2 shows a block diagram of one embodiment of a position signal generator in the distance measuring circuit 14 shown in FIG. 1. A synchronous signal generator 20 generates an x-axis sync. signal and a y-axis sync. signal shown in (A) and (C) of FIG. 3, respectively, in response to which signals the scan signal generator 7 shown in FIG. 1 generates the x-axis scan signal and the y-axis scan signal shown in (B) and (D) of FIG. 3, respectively.

Figure 3:
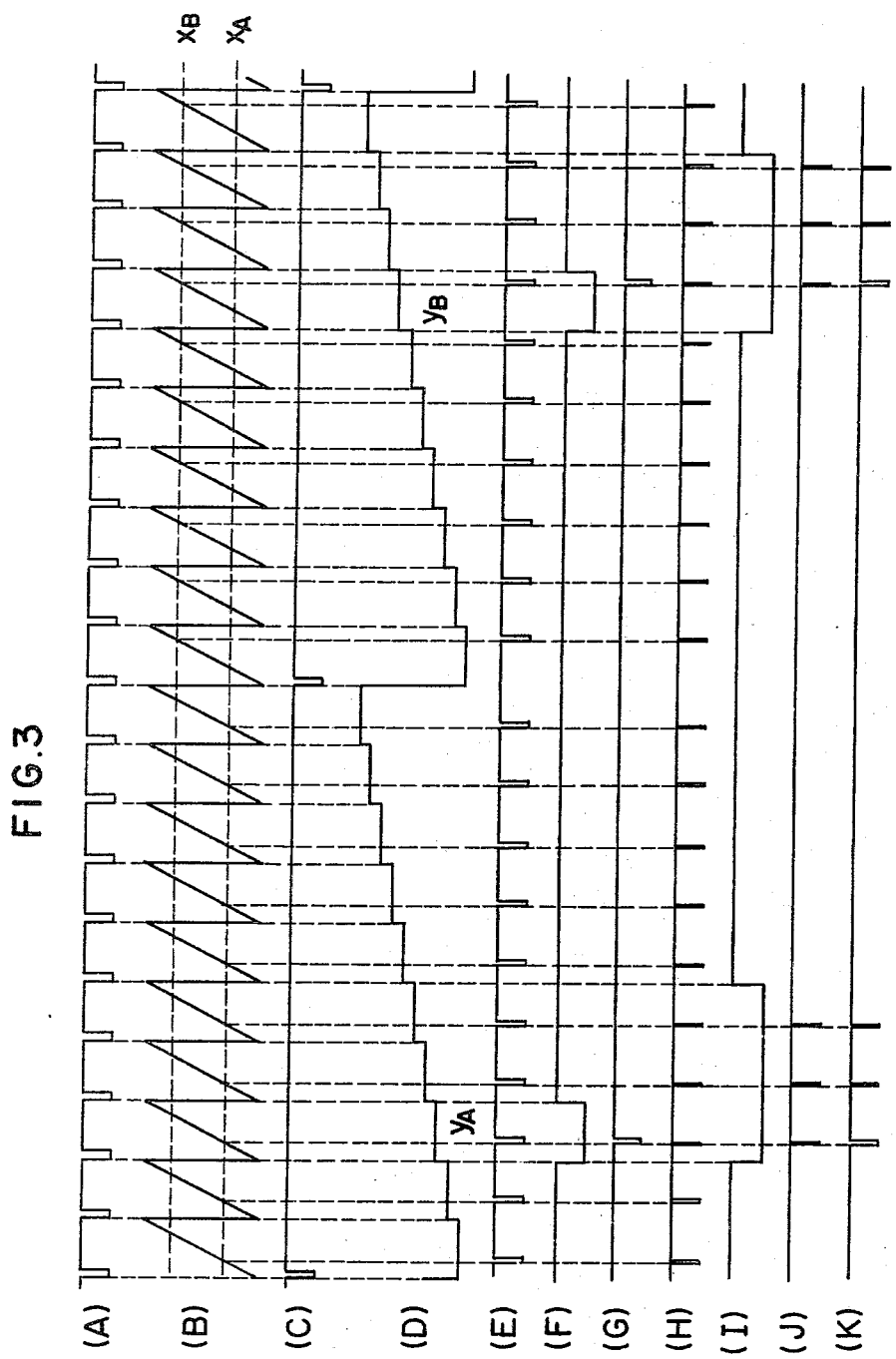
FIG. 3 is a time chart for illustrating the operation of the embodiment shown in FIG. 2.

The x-axis sync. signal shown in (A) of FIG. 3, which is generated by the sync. signal generator 20, is applied to a mark coordinate control circuit 21, which includes a memory for storing a mark coordinate to be displayed on the CRT 13. First, let consider only the first cycle period of the y-axis scan signal shown in (D) of FIG. 3. By adjusting a coordinate setter 22 which may be a knob on a control panel, an x-axis coordinate signal $x_A$ of a first mark to be displayed on the CRT, which signal is produced from the mark coordinate control circuit 21, is set into an x-axis coordinate register 23. The x-axis coordinate signal in the x-axis coordinate register 23 is transferred to an x-axis coordinate counting register 24 in response to the x-axis sync. signal. Clock pulses having a frequency of as 100 to 500 times as high as that of the x-axis sync. signal shown in (A) of FIG. 3 are generated by a pulse generator 25 and they are applied to the x-axis coordinate counting register 24 and counted up thereby. An overflow (carry) signal or a borrow signal from the counting register 24 triggers pulse generators 26 and 27. The pulse generator 26 generates long-duration pulses shown in (E) of FIG. 3 while the pulse generator 27 generates short-duration pulses shown in (H) of FIG. 3. The pulses from the pulse generators 26 and 27 are applied to first inputs to AND gates 28 and 29, respectively. An output control circuit 30 produces a signal shown in (F) of FIG. 3 for specifying a y-axis coordinate signal $y_A$ of the first mark by adjusting the mark coordinate setter 22, at an output terminal 31, and at the same time produces a signal shown in (I) of FIG. 3 at another output terminal 32. Those signals are applied to second inputs to the AND gates 28 and 29, respectively, which produce signals shown in (G) and (J) of FIG. 3, respectively, at outputs thereof. Those output signals are applied to an OR gate 33, which produces a signal shown in (K) of FIG. 3 at an output thereof.

Let now consider a second cycle period of the y-axis scan signal shown in (D) of FIG. 3. In this cycle period, the exactly same operation as that in the first cycle period is carried out for an x-axis coordinate signal $x_B$ and a y-axis coordinate signal $y_B$ of a second mark to be displayed on the CRT 13. In and after third cycle period, the operation for $x_A$ and $y_A$ in the first cycle period and the operation for $x_B$ and $y_B$ in the second cycle period are alternately and repetitively carried out.

Figure 4:
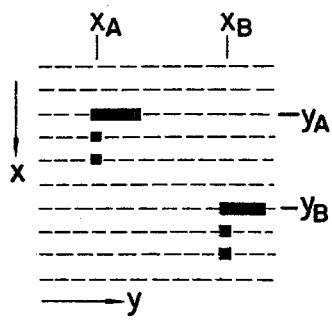
FIG. 4 shows marks displayed in accordance with the embodiment shown in FIG. 2.

A signal shown in (K) of FIG. 3 is combined in the signal combining circuit 12 in FIG. 1 with the signal from the amplifier 11 in FIG. 1 and the combined signal is applied to the CRT 13 as the brightness modulation signal. Accordingly, the first mark defined by $(x_A, y_A)$ and the second mark defined by $(x_B, y_B)$ are displayed on the CRT 13 in superposition to the image of the sample 4. FIG. 4 shows the display of the first and second marks displayed on the CRT 13 in the manner described above. In FIG. 4, a left top L-shaped mark represents the first mark defined by $(x_A, y_A)$, and a right bottom L-shaped mark represents the second mark defined by $(x_B, y_B)$. A plurality of dotted lines represent scan lines.

The coordinates $(x_A, y_A)$ and $(x_B, y_B)$ of the first and second marks can be chosen arbitrarily, and the selection can be commanded by controlling the coordinate setter 22.

In the embodiment shown in FIG. 2, the position signal $(x_A, y_A)$ of the first mark and the position signal $(x_B, y_B)$ of the second mark are generated alternately in odd-numbered cycle and even-numbered cycle of the signal shown in (D) of FIG. 3. Alternatively, three marks can be displayed on the CRT 13 by generating the position signal $(x_A, y_A)$ in the first cycle, the position signal $(x_B, y_B)$ in the second cycle and a position signal $(x_C, y_C)$ in the third cycle. In a similar way, it is possible to display four or more marks. In the embodiment of FIG. 2, the system comprising the x-axis coordinate register 23, the x-axis coordinate counting register 24 and the pulse generators 26 and 27 is related to both the x-axis coordinate signal $x_A$ of the first mark and the x-axis coordinate signal $x_B$ of the second mark. However, if the system is related to only the x-axis coordinate signal $x_A$ of the first mark, it is possible to generate a plurality of mark position signals by providing a plurality of same systems.

While the marks shown in the embodiment of FIG. 2 are of L-shape, the marks may be of any shape such as rectangular, circular or cross and they may be of any size. The mark position signal generator and display circuit may be of the type disclosed in the above-mentioned U.S. Pat. No. 4,039,829.

FIG. 5 is a view which stereoscopically shows a relation between the sample 4 and the CRT 13 when the tilt angle of the sample 4 is $\theta$ and the rotation angle or azimuth angle is $\alpha$, and FIG. 6 shows a view taken in z-axis direction in FIG. 5. In those figures, a plane AEBC is an image plane, and a plane AFDC is a sample plane, and an x-y plane which is normal to the z-axis direction representing an axial direction of the electron beam is shown to coincide with the image plane AEBC. Accordingly, an axis AC is a sample tilt axis. Referring to those figures, the distance between the points A and D on the sample 4 which correspond to the positions A and B of the two marks displayed on the CRT 13 is determined in the following manner. Assuming that $$\Delta x = x_A - x_B, \Delta = y_A - y_B,$$

then $$AC = \Delta y \cos \alpha - \Delta x \sin \alpha \qquad (1)$$

$$BC = \Delta x \cos \alpha + \Delta y \sin \alpha \qquad (2)$$

$$CD = BC/\cos \theta = (\Delta x \cos \alpha + \Delta y \sin \alpha)/\cos \theta \qquad (3)$$

$$\begin{aligned} AD &= \{(AC)^2 + (CD)^2\}^{\frac{1}{2}} \\ &= \{(\Delta y \cos \alpha - \Delta x \sin \alpha)^2 \\ &\quad + (\Delta x \cos \alpha + \Delta y \sin \alpha)^2/\cos^2\theta \}^{\frac{1}{2}} \end{aligned} \qquad (4)$$

FIG. 7 shows a block diagram of one embodiment of a distance calculation circuit of the distance measuring circuit 14 shown in FIG. 1. The equation (4) is calculated using the distance calculation circuit so that the real distance between the two points on the sample 4 which correspond to the positions of the two marks displayed on the CRT 13 can be precisely determined.

A multiplexor 1120 is switched by a multiplexor control signal 1111 from a control circuit 1130 so that the x-axis coordinate $x_A$ of the first mark from a terminal 1101 is written into a two-port memory 1121 (which can simultaneously read and write by two-channel address). Thus, the x-axis coordinate $x_A$ is stored in a predetermined area of the memory 1121. The y-axis coordinate $y_A$ of the first mark as well as the x-axis and y-axis coordinates $x_B$ and $y_B$ of the second mark, from the terminals 1101 are similarly stored in the memory 1121. The magnification factor from a terminal 1103 is also stored in the memory 1121. In addition, the tilt angle $\theta$ from a terminal 1102 is converted to a trigonometrical function conversion circuit 1128 (which may be composed of a read-only memory) to a cosine function, and the rotation angle $\alpha$ from a terminal 1114 is converted by the trigonometrical function conversion circuit 1128 to a sine function and a cosine function. Those functions are also written into the memory 1121. The x-axis coordinate $x_A$ is addressed by a memory address 1106 and the x-axis coordinate $x_B$ is addressed by a memory address 1107 when they are to be read out of the memory 1121. A difference $\Delta x$ between those coordinates is calculated by an addition/subtraction circuit 1123. The difference $\Delta x$ is stored in a temporary memory 1105 through the multiplexor 1120 and then stored in the area for $\Delta x$ in the memory 1121. The y-axis coordinate $y_A$ is addressed by a memory address 1106 and the y-axis coordinate $y_B$ is addressed by a memory address 1107 when they are to be read out of the memory 1121. A difference $\Delta y$ between those coordinates is calculated by an addition/subtraction circuit 1123. The difference $\Delta y$ is stored in a temporary memory 1105 and then stored in the area for $\Delta y$ in the memory 1121. The difference $\Delta y$ and the $\cos \alpha$ are addressed by the memory addresses 1106 and 1107 and read out of the memory 1121. A product $\Delta y \cos \alpha$ is calculated in a multiplication circuit 1124 and stored in a predetermined area (W1) in the memory 1121. Similarly, a product $\Delta x \sin \alpha$ is calculated and stored in a predetermined area (W2). The areas W1 and W2 are addressed by the memory addresses 1106 and 1107 so that the contents therein are read out and subtracted from the other in the addition/subtraction circuit 1123. The difference thereof is stored in the area W1. The area W1 is again addressed by the memory addresses 1106 and 1107 so that the contents therein are read out and multiplied with each other and the product thereof is stored in the area W1. The $\Delta x$ and the $\cos \alpha$ are addressed by the memory addresses 1106 and 1107 and a product $\Delta x \cos \alpha$ is calculated in the multiplication circuit 1124 and stored in the area W2. The $\Delta y$ and the $\sin \alpha$ are addressed by the memory addresses 1106 and 1107 and a product $\Delta y \sin \alpha$ is calculated in the multiplication circuit 1124 and stored in a predetermined area (W3). The areas W2 and W3 are addressed by the memory addresses 1106 and 1107 and a sum of the contents in those areas is calculated in the addition/subtraction circuit 1123 and stored in the area W2. The area W1 and the area for $\cos \theta$ are addressed by the memory addresses 1106 and 1107 and the content in the area W1 is divided by $\cos \theta$ in a division circuit 1125 and a quotient thereof is stored in the area W2. The area W2 is addressed by the memory address 1107 and the content therein is multiplied by itself (squaring) in the multiplication circuit 1124 and a product thereof is stored in the area W2. The areas W1 and W2 are addressed by the memory addresses 1106 and 1107 and a sum of the contents in those areas is calculated in the addition/subtraction circuit 1123 and stored in the area W1. The area W1 is addressed by the address 1106 and a root of the content in that area is calculated in a root circuit 1126 and stored in the area W1. The area W1 and the area for the magnification factor are addressed by the memory addresses 1106 and 1107 and a product of the contents in those areas is calculated in the multiplication circuit 1124 and stored in the area W1. The area W1 is addressed by the memory address 1106 and the content in that area is supplied to a conversion circuit 1122 where it is converted to a decimal number, which is displayed on a display device 1127. Consequently, the number displayed on the display device 1127 is equal to the equation (4) multiplied by the magnification factor, i.e., the precise real distance between the two points on the sample 4 which correspond to the first mark position A and the second mark position B. Of course, this number has been corrected for the tilt angle $\theta$ and the rotation angle $\alpha$ of the sample 4.

Thus, in accordance with the embodiment shown in FIG. 7, even if the sample 4 is tilted by a certain angle and rotated by a certain amount, the real distance between the two points on the sample 4 which correspond to the mark positions of the marks displayed on the CRT 13 can be precisely determined based on the coordinates of the marks displayed on the CRT 13, and this distance can be determined without slightly changing the incident angle of the electron beam to the sample in rapid and repetitive manner. Accordingly, the embodiment of FIG. 7 can be applied to a scanning type electron microscope of a kind which does not provide a stereoscopic view of the sample, without modifying the tube of the microscope.

In FIG. 7, the angles $\theta$ and $\alpha$ and the magnification factors may or may not be automatically provided by the sample actuator 6 and the magnification factor setting circuit 8 shown in FIG. 1. Further, the result of computation by the embodiment of FIG. 7 may be obtained from a microcomputer.

The explanation thus far relates to an example where the distance between the two points on the sample is calculated when the tilt angle is known. However, there may be a case where the real distance between the two points on the sample is to be determined when the tilt angle is not known. In such a case, an image of the sample 4 is obtained while the sample 4 is tilted by an unknown angle $\theta$, first and second marks are displayed on two points $(x_A, y_A)$ and $(x_B, y_B)$ on the image, the sample is then tilted by a known angle $\Delta\theta$ and the image of the sample is obtained at the tilted position, first and second positions are displayed on two points $(x_A', y_A')$ and $(x_B', y_B')$ on the image corresponding to the points $(x_A, y_A)$ and $(x_B, y_B)$, and the distance between the two points on the sample is determined from the coordinates $(x_A, y_A)$, $(x_B, y_B)$, $(x_A', y_A')$ and $(x_B', y_B')$ and the angle $\Delta\theta$.

The method of determining the distance between the two points, described above makes use of a view difference between the two images. The method of determining the distance is explained with reference to FIGS. 8a and 8b. FIGS. 8a and 8b are views which stereoscopically show a relation between a sample plane and an image plane. In FIG. 8a the sample plane AFDC makes an angle $\theta$ with the image plane AEBC, and in FIG. 8b, the sample plane A'F'D'C' makes an angle $\theta+\Delta\theta$ with the image plane A'E'B'C'. An axis AC and an axis A'C' are tilt axes and they are of equal length. Therefore, a length L on the sample is expressed as follows for FIGS. 8a and 8b, respectively.

$$L = (a^2 + b^2 \sec^2 \theta)^{\frac{1}{2}} \tag{5}$$

$$L = [a^2 + b'^2 \sec(\theta + \Delta\theta)]^{\frac{1}{2}} \tag{6}$$

where $a = a' = AC = A'C'$, $b = CB$ and $b' = C'B'$.

By solving the equations (5) and (6), we get;

$$L = (b^2 + b'^2 - 2bb' \cos \Delta\theta + a^2 \sin^2 \Delta\theta)^{\frac{1}{2}} / \sin \Delta\theta \tag{7}$$

Assuming that the positions of the first and second marks on the image planes AEBC and A'E'B'C' are at A, B, A', B', respectively and the coordinates of those mark positions are defined by $(x_A, y_B)$, $(x_B, y_B)$, $(x_A', y_{A'})$, $(x_B', y_{B'})$, respectively, then:

$$\left.\begin{array}{l}\Delta x_1 = x_A - x_B, \Delta y_1 = y_A - y_B \\ \Delta x_2 = x_{A'} - x_{B'}, \Delta y_2 = y_{A'} - y_{B'}\end{array}\right\} \tag{8}$$

Since the rotation angle $\alpha$ is constant, we get from the equation (1):

$$\Delta y_1 \cos \alpha - \Delta x_1 \sin \alpha = \Delta y_2 \cos \alpha - \Delta x_2 \sin \alpha$$

Accordingly, $$\sin \alpha / \cos \alpha = (\Delta y_1 - \Delta y_2)/(\Delta x_1 - \Delta x_2) \tag{9}$$

$$\cos^2 \alpha = (\Delta x_1 - \Delta x_2)^2 / \{(\Delta y_1 - \Delta y_2)^2 + (\Delta x_1 - \Delta x_2)^2\} \tag{10}$$

$$\sin^2 \alpha = (\Delta y_1 - \Delta y_2)^2 / \{(\Delta y_1 - \Delta y_2)^2 + (\Delta x_1 - \Delta x_2)^2\} \tag{11}$$

$$\begin{array}{l}\sin \alpha \cos \\ \alpha = (\Delta x_1 - \Delta x_2)(\Delta y_1 - \Delta y_2)/\{(\Delta y_1 \\ -y_2)^2 + (\Delta x_1 - \Delta x_2)^2\}\end{array} \tag{12}$$

From those equations and the equation (3), we get $$\begin{aligned}b^2 &= (\Delta x_1 \cos \alpha + \Delta y_1 \sin \alpha)^2 \\ &= \{\Delta x_1^2(\Delta x_1 - \Delta x_2)^2 + 2\Delta x_1 \Delta y_1(\Delta x_1 - \Delta x_2) \\ &\quad (\Delta y_1 - \Delta y_2) = \Delta y_1^2(\Delta y_1 - \Delta y_2)^2\}/ \\ &\quad \{(\Delta y_1 - \Delta y_2)^2 + (\Delta x_1 - \Delta x_2)^2\}\end{aligned} \tag{13}$$

$$\begin{aligned}b'^2 &= \{\Delta x_2^2(\Delta x_1 - \Delta x_2)^2 + 2\Delta x_2 \Delta y_2(\Delta x_1 - \Delta x_2) \\ &\quad (\Delta y_1 - \Delta y_2) + \Delta y_2^2(\Delta y_1 - \Delta y_2)^2\}/ \\ &\quad \{(\Delta y_1 - \Delta y_2)^2 + (\Delta x_1 - \Delta x_2)^2\}\end{aligned} \tag{14}$$

$$\begin{aligned}bb' &= \{\Delta x_1\Delta x_2(\Delta x_1 - \Delta x_2)^2 + (\Delta x_1 \Delta y_2 + \Delta x_2 \Delta y_1) \\ &\quad x (\Delta x_1 - \Delta x_2)(\Delta y_1 - \Delta y_2) \\ &\quad + \Delta y_1 \Delta y_2 (\Delta y_1 - \Delta y_2)^2\} \\ &\quad \div \{(\Delta y_1 - \Delta y_2)^2 + (\Delta x_1 - \Delta x_2)^2\}\end{aligned} \tag{15}$$

$$\begin{aligned}a^2 &= \{\Delta y_1^2(\Delta x_1 - \Delta x_2)^2 \\ &\quad - 2\Delta y_1 \Delta x_1(\Delta x_1 - \Delta x_2)(\Delta y_1 - \Delta y_2) \\ &\quad + \Delta y_1^2(\Delta y_1 - \Delta y_2)^2\}/ \\ &\quad \{(\Delta y_1 - \Delta y_2)^2 + (\Delta x_1 - \Delta x_2)^2\}\end{aligned} \tag{16}$$

By putting the equations (13)–(16) to the equation (7), we get:

$$\begin{aligned}L = \frac{1}{\sin \Delta\theta} &\left[\left[\frac{1}{(\Delta y_1 - \Delta y_2)^2 + (\Delta x_1 - \Delta x_2)^2}\right.\right. \\ &\times [\{\Delta x_1(\Delta x_1 - \Delta x_2) + \Delta y_1(\Delta y_1 - \Delta y_2)\}^2 \\ &+ \{\Delta x_2(\Delta x_1 - \Delta x_2) + \Delta y_2(\Delta y_1 - \Delta y_2)\}^2 \\ &- \{\Delta x_1(\Delta x_1 - \Delta x_2) + \Delta y_1(\Delta y_1 - \Delta y_2)\} \\ &\times \{\Delta x_2(\Delta x_1 - \Delta x_2) + \Delta y_2(\Delta y_1 - \Delta y_2)\} \cos \theta \\ &\left.\left.+ \{\Delta y_1(\Delta x_1 - \Delta x_2) - \Delta x_1(\Delta y_1 - \Delta y_2)^2 \sin \Delta\theta\right]\right]^{\frac{1}{2}}\end{aligned} \tag{17}$$

The equation (17) indicates that even if the angle $\theta$ is not known, the distance between the two points on the sample, which distance has been corrected for the tilt angle $\theta$ and the rotation angle $\alpha$, can be precisely determined so long as the coordinates of the first and second marks on the two images defined by the equation (8) are given.

FIG. 9 shows another embodiment of the distance calculation circuit in the distance measuring circuit 14 shown in FIG. 1. The equation (17) is calculated using this circuit to precisely determine the real distance between the two points on the sample corresponding to the positions of the first and second marks on each of the two images displayed time-independently on the CRT 13.

The circuit of FIG. 9 comprises a two-port memory 1021, a multiplexor 1020 for switching input to the memory 1021, arithmetic operation circuits 1023–1026, a conversion circuit 1022, a display device 1027, a trigonometric function conversion circuit 1028, a temporary memory 105 and a control circuit 1030 for controlling the overall operation.

An area of the memory 1021 in which the x-axis coordinate $x_A$ from a terminal 1001 is to be stored is addressed by a memory address 1006 and the multiplexor 1020 is selected by a control signal 1011 to store the $x_A$ in that area so that the $x_A$ is stored in the area in which it is to be stored. Other coordinates $x_B$, $y_A$, $y_B$, $x_A'$, $y_A'$, $x_B'$, $y_B'$ from the terminals 1001 are also stored in predetermined areas in which they are to be stored. Similarly, the magnification factor from a terminal 1003 is also stored in a predetermined area in which it is to be stored. The angle $\Delta\theta$ from a terminal 1002 is sine-converted by the trigonometric function conversion circuit 1028, which produces $\sin\theta$ which is similarly stored in a predetermined area. Further, the $\Delta\theta$ from the terminal 1002 is cosine-converted in the trigonometric function conversion circuit 1028, which produces $\cos\theta$ which is similarly stored in a predetermined area. The area for the $x_A$ is addressed by the memory address 1006 and the area for the $x_B$ is addressed by the memory address 1007 to read out the $x_A$ and $x_B$, which are then subtracted one from the other in the addition/subtraction circuit 1023. A resulting difference $\Delta x_1$ is stored in the temporary memory 1105 through the multiplexor 1020 and then stored in the area in the memory 1021 in which the $\Delta x_1$ is to be stored. In the exactly same manner, differences $\Delta y_1$, $\Delta x_2$ and $\Delta y_2$ are calculated and they are stored in areas in which they are to be stored. The areas for the $\Delta x_1$ is addressed by the memory address 1006 and the area for the $\Delta x_2$ is addressed by the memory address 1007 to read out the $\Delta x_1$ and $\Delta x_2$, and a difference between the $\Delta x_1$ and $\Delta x_2$ is calculated in the addition/subtraction circuit 1023. A resulting difference $\Delta x_1 - \Delta x_2$ is stored in the temporary memory 1005 through the multiplexor 1020 and then stored in a predetermined area (W1) in the memory 1021. In the exactly same way, a difference $\Delta y_1 - \Delta y_2$ is calculated and it is stored in a predetermined area (W2) in the memory 1021. The $\Delta x_1$ and the $(\Delta x_1 - \Delta x_2)$ are read by addressing the area for the $\Delta x_1$ and the area W1, respectively, by the memory address 1006 and they are multiplied to each other in the multiplication circuit 1024. A resulting product $\Delta x_1 (\Delta x_1 - \Delta x_2)$ is stored in a predetermined area (W3) through the multiplexor 1020 and the memory 1005. The $\Delta y_1$ and the $(\Delta y_1 - \Delta y_2)$ are read out by addressing the area for the $\Delta y_1$ by the memory address 1006 and the area W2 by the memory address 1007 and they are multiplied to each other in the multiplication circuit 1024. A resulting product $\Delta y_1 (\Delta y_1 - \Delta y_2)$ is similarly stored in a predetermined area (W4). The area W3 is addressed by the memory address 1006 and the area W4 is addressed by the memory address 1007, and the contents in those areas are added together in the addition/subtraction circuit 1023. A resulting sum is stored in the area W3. The area W3 is addressed by the memory addresses 1006 and 1007 and the content therein is multiplied by itself (squaring). A resulting product is stored in the area W4. The $\Delta x_2$ and the $(\Delta x_1 - \Delta x_2)$ are read out by addressing the area for the $\Delta x_2$ and the area W1 by the memory addresses 1006 and 1007 and they are multiplied to each other in the multiplication circuit 1024. A resulting product $\Delta x_2 (\Delta x_1 - \Delta x_2)$ is stored in a predetermined area (W5). The $\Delta y_2$ and the $(\Delta y_1 - y_2)$ are read out by addressing the area for $\Delta y_2$ and the area W2 by the memory addresses 1006 and 1007 and they are multiplied to each other in the multiplication circuit 1024. A resulting product $\Delta y_2(\Delta y_1 - y_2)$ is stored in a predetermined area (W6). The areas W5 and W6 are addressed by the memory addresses 1006 and 1007 and the contents therein are added together in the addition/subtraction circuit 1023. A resulting sum is stored in the area W5. The area W5 is addressed by the memory addresses 1006 and 1007 and the content therein is multiplied by itself (squaring). A resulting product is stored in the area W6. The area W3 is addressed by the memory address 1006 and the area W5 is addressed by the memory address 1007, and the contents therein are multiplied to each other in the multiplication circuit 1024. A resulting product is stored in the area W3. The area W3 is addressed by the memory address 1006 and the content therein is added to itself (doubling). A resulting sum is stored in the area W3. The area W3 is addressed by the memory address 1006 and the area for the $\cos\Delta\theta$ is addressed by the memory address 1007, and the content in the area W3 and the $\cos\Delta\theta$ are multiplied to each other in the multiplication circuit 1024. A resulting product is stored in the area W3. The area W4 is addressed by the memory address 1006 and the area W3 is addressed by the memory address 1007, and the contents therein are subtracted one from the other in the addition/subtraction circuit 1023. A resulting difference is stored in the area W3. The area W3 is addressed by the memory address 1006 and the area W6 is addressed by the memory address 1007, and the contents therein are added together in the addition/subtraction circuit 1023. A resulting sum is stored in the area W3. The are for the $\Delta y_1$ is addressed by the memory address 1006 and the area W1 is stored in the memory address 1007 to read out the $\Delta y_1$ and the $(\Delta x_1 - \Delta x_2)$, which are multiplied to each other in the multiplication circuit 1024. A resulting product is stored in the area W5. The area for the $\Delta x_1$ is addressed by the memory address 1006 and the area W2 is addressed by the memory address 1007 to read out the $\Delta x_1$ and the $(\Delta y_1 - \Delta y_2)$, which are multiplied to each other in the multiplication circuit 1024. A resulting product is stored in the area W6. The areas W5 and W6 are addressed by the memory addresses 1006 and 1007 and the contents therein are subtracted one from the other in the addition/subtraction circuit 1023. A resulting difference is stored in the area W4. The area W4 is addressed by the memory address 1006 and the area for the $\sin\Delta\theta$ is addressed by the memory address 1007 to read out the content in the area W4 and the $\sin\Delta\theta$, which are multiplied to each other in the multiplication circuit 1024. A resulting product is stored in the area W4. The area W4 is addressed by the memory addresses 1006 and 1007 and the content therein is multiplied by itself (squaring) in the multiplication circuit 1024. A resulting product is stored in the area W4. The area W3 is addressed by the memory address 1006 and the area W4 is addressed by the memory address 1007, and the contents therein are added together in the addition/subtraction circuit 1023. A resulting sum is stored in the area W3. The $(\Delta y_1 - \Delta y_2)$ is read out by addressing the area W2 by the memory addresses 1006 and 1007, and it is multiplied by itself (squaring) in the multiplication circuit 1024. A resulting product is stored in the area W2. The $(\Delta x_1 - \Delta x_2)$ is read out by addressing the area W1 by the memory addresses 1006 and 1007 and it is multiplied by itself (squaring) in the multiplication circuit 1024. A resulting product is stored in the area W1. The areas W1 and W2 are addressed by the memory addresses 1006 and 1007, respectively, and the contents therein are added together in the addition/subtraction circuit 1023. A resulting sum is stored in the area W1. The areas W3 and W1 are addressed by the memory addresses 1006 and 1007, respectively, and the contents therein are divided one by the other in the division circuit 1025. A resulting quotient is stored in the area W1. The area W1 is addressed by the memory address 1006 and the content therein is supplied to the root circuit 1026 to calculate a root thereof. A resulting root is stored in the area W1. The area W1 is addressed by the memory addresses 1006 and the area for the sin $\Delta\theta$ is addressed by the memory address 1007 to read out the content in the area W1 and the sin $\Delta\theta$, which are divided one by the other in the division circuit 1025. A resulting quotient is stored in the area W1. The area W1 is addressed by the memory address 1006 and the area for the magnification factor is addressed by the memory address 1007 to read out the content in the area W1 and the magnification factor, which are multiplied to each other in the multiplication circuit 1024. A resulting product is stored in the area W1. The content in the area W1 is read out and converted to a decimal number in the conversion circuit 1022 and the decimal number is displayed on the display device 1027. Consequently, the number displayed on the display device 1027 corresponds to the equation (17) multiplied by the magnification factor, that is, it represents the real and precise distance between the two points on the sample 4 which correspond to the positions of the first and second marks displayed to superpose on the two images. Of course, this number is obtained without knowing the tilt angle $\theta$ while the sample is tilted by $\theta$ and rotated by $\alpha$.

Thus, the embodiment of FIG. 9 can also attains the same object as that attained by the embodiment of FIG. 7. The advantage that the precise distance between the two points on the sample 4 can be determined even if the tilt angle $\theta$ is not known, which is attained by the embodiment of FIG. 9 has not been attained in the embodiment of FIG. 7.

In FIG. 9, the information $\Delta\theta$ may be or may not be derived from the sample actuator 6 shown in FIG. 6.

The foregoing embodiments relate to the determination of the distance between the two points on the sample. Where three marks are displayed on the CRT 13, the distances between respective points can be determined, and when a triangle is drawn by connecting the three points by straight lines, a length of a normal line from an apex to a base side can be determined.

FIG. 10 shows a triangle drawn by connecting three points H, J, K on the sample. By designing the mark signal generator and the display circuit such that the three marks representing the points H, J, K on the sample are displayed on the CRT, the lengths $L_1$, $L_2$ and $L_3$ can be determined by a similar circuit to those shown in FIGS. 7 and 9. From FIG. 10, we get:

$$L_1 = \{(L_3^2 - L_4^2) + (L_2^2 - L_4^2)\}^{\frac{1}{2}} \tag{18}$$

By solving the above equation, we get:

$$L_4 = (2L_1^2 L_2^2 + 2L_2^2 L_3^2 + 2L_3^2 L_1^2 - L_1^4 - L_2^4 - L_3^4)^{\frac{1}{2}} / 2L_1 \tag{19}$$

Accordingly, by additionally providing a circuit for calculating the equation (19) based on the $L_1$, $L_2$ and $L_3$ obtained, the length of the normal line $L_4$ can be determined. It should be understood that a circuit for calculating an area of the triangle shown in FIG. 10 may also be provided.

While the preferred embodiments have been shown and described in connection with the accompanying drawings, it should be understood that various changes and modifications may be made by those skilled in the art without departing from the spirit of the present invention and hence the present invention should not be restricted by the appended claims.

What we claim is:

1. A scanning type electron microscope comprising:
   means for generating an electron beam;
   means for bidimensionally scanning a sample with said electron beam to derive an information signal inherent to said sample from said sample;
   means for displaying an image of said sample based on said information signal;
   means for tilting said sample by any tilt angle relative to said electron beam and holding said sample in the tilted position;
   means for rotating said sample by any azimuth angle and holding said sample in the rotated position;
   means displaying, on said image, first and second marks corresponding to different first and second points on said sample in superposition to said image; and
   means for calculating a distance between said first and second points based on coordinates of said first and second marks, said tilt angle and said azimuth angle.

2. A scanning type electron microscope comprising:
   means for generating an electron beam;
   means for bidimensionally scanning a sample with said electron beam to derive an information signal inherent to said sample from said sample;
   means for displaying an image of said sample based on said information signal;
   means for tilting said sample by any tilt angle relative to said electron beam and holding said sample in the tilted position;
   means for rotating said sample by any azimuth angle relative to said electron beam and holding said sample in the rotated position;
   means for displaying, on said image, first and second marks corresponding to different first second positions on said sample, respectively, in superposition to said image; and
   means for calculating a distance between said first and second points based on coordinates of said first and second marks, said tilt angle, said azimuth angle and a magnification factor of said image.

3. A scanning type electron microscope according to claim 2, further comprising means for supplying the tilt angle and the azimuth angle to said calculation means from said sample tilting and holding means and said sample rotating and holding means, respectively.

4. A scanning type electron microscope according to claim 3, further comprising means for setting the magnification factor of said image and means for supplying an information on the set magnification factor to said calculation means from said magnification factor setting means.

* * * * *